(12) United States Patent  
Lee (10) Patent No.: US 9,685,422 B2  
(45) Date of Patent: Jun. 20, 2017

(54) SEMICONDUCTOR PACKAGE DEVICE

(71) Applicant: SK hynix Inc., Icheon-si, Gyeonggi-do (KR)

(72) Inventor: Tae Yong Lee, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 14/956,695

(22) Filed: Dec. 2, 2015

(65) Prior Publication Data

US 2017/0084574 A1 Mar. 23, 2017

(30) Foreign Application Priority Data

Sep. 18, 2015 (KR) .................. 10-2015-0132540

(51) Int. Cl.
*H01L 23/48* (2006.01)
*H01L 25/065* (2006.01)

(52) U.S. Cl.
CPC ...... *H01L 25/0652* (2013.01); *H01L 2225/06517* (2013.01); *H01L 2225/06527* (2013.01); *H01L 2225/06596* (2013.01)

(58) Field of Classification Search
CPC ..... H01L 24/17; H01L 25/0657; H01L 23/48; H01L 23/481; H01L 25/065; H01L 25/0652

See application file for complete search history.

(56) References Cited

U.S. PATENT DOCUMENTS

| | | | | |
|---|---|---|---|---|
| 8,198,627 | B2* | 6/2012 | Jeong | G01R 31/2884 257/48 |
| 8,796,863 | B2 | 8/2014 | Lee et al. | |
| 8,799,730 | B2* | 8/2014 | Oh | H01L 23/481 714/727 |
| 2011/0012633 | A1* | 1/2011 | Rahman | G01R 31/318544 324/754.07 |
| 2011/0316572 | A1* | 12/2011 | Rahman | G01R 31/2853 324/754.03 |
| 2012/0272112 | A1* | 10/2012 | Oh | H01L 23/481 714/727 |
| 2013/0024737 | A1 | 1/2013 | Marinissen et al. | |
| 2013/0037802 | A1* | 2/2013 | England | H01L 21/568 257/48 |
| 2013/0147505 | A1* | 6/2013 | Wang | G01R 1/07342 324/755.01 |
| 2014/0006864 | A1* | 1/2014 | Menon | G11C 29/022 714/32 |
| 2014/0264337 | A1* | 9/2014 | Chen | H01L 22/32 257/48 |
| 2014/0264769 | A1* | 9/2014 | Chen | H01L 24/14 257/620 |

(Continued)

*Primary Examiner* — Fazli Erdem
(74) *Attorney, Agent, or Firm* — William Park & Associates Ltd.

(57) ABSTRACT

A semiconductor package may include a first chip located over a substrate. The semiconductor package may include a second chip located over the substrate and adjacent to the first chip. The semiconductor package may include a test micro-bump located at a layer below the first chip and above the substrate, and electrically coupled to an external connection member through a first path. The semiconductor package may include a normal micro-bump located at a layer below the first chip and above the substrate, and electrically coupled to the second chip through a second path.

21 Claims, 7 Drawing Sheets

(56) References Cited

U.S. PATENT DOCUMENTS

| | | | |
|---|---|---|---|
| 2015/0177320 A1* | 6/2015 | Lee | G01R 31/3177 |
| | | | 714/727 |
| 2015/0235936 A1* | 8/2015 | Yu | H01L 23/49816 |
| | | | 257/738 |
| 2015/0262898 A1* | 9/2015 | Chen | H01L 24/49 |
| | | | 257/48 |

* cited by examiner

SEMICONDUCTOR PACKAGE DEVICE

CROSS-REFERENCE TO A RELATED APPLICATION

This application claims priority based upon Korean patent application No. 10-2015-0132540, filed on Sep. 18, 2015, the disclosure of which is hereby incorporated in its entirety by reference herein.

BACKGROUND

1. Technical Field

Embodiments of the present disclosure generally relate to a semiconductor package device, and more particularly to a technology for testing a semiconductor device including a bump pad.

2. Related Art

High bandwidth characteristics are continuously needed for semiconductor devices. Specifically, in order to improve system operational characteristics of mobile memory products, the demand of increasing the number of input/output (I/O) pins (i.e., data pins capable of being simultaneously accessed) is rapidly increasing.

However, the increased number of I/O pins may encounter unexpected problems in the chip size and packaging. For example, assuming that data is 256 bits long, at least 500 balls are needed for package fabrication due to the occurrence of ball-out.

However, fabrication of the package having at least 500 balls is realistically impossible. Especially, it is almost impossible to fabricate such package having at least 500 balls in industrial fields of smaller-sized packages such as mobile memory products.

As a result, a new packaging technology, i.e., micro-bump (μ-Bump) technology, has recently been developed. A control chip and a memory chip for use in general mobile products are designed to perform point-to-point access.

Considering the above-mentioned characteristics, the micro-bump (μ-Bump) technology is a package technology in which the positions of both pads are identical with respect to an interface signal needed between the control chip and the memory chip such that one pad can be directly coupled to the other pad without wiring.

However, in the case of using the micro-bump (μ-Bump) technology, it may be difficult to perform wafer testing because of the presence of small-sized pads. In other words, since each pad is small in size, it may be difficult to perform pad probing during wafer testing.

BRIEF SUMMARY OF THE INVENTION

Various embodiments of the present disclosure may be directed to providing a semiconductor package device that substantially obviates one or more problems due to limitations and disadvantages of the related art.

The embodiments of the present disclosure may relate to a semiconductor package device configured to perform a direct access test in a package state using a wafer test pad.

In accordance with an embodiment, a semiconductor package device may be provided. The semiconductor package device may include a first chip located over a substrate. The semiconductor package may include a second chip located over the substrate and adjacent to the first chip. The semiconductor package may include a test micro-bump located at a layer below the first chip and above the substrate, and electrically coupled to an external connection member through a first path. The semiconductor package may include a normal micro-bump located at a layer below the first chip and above the substrate, and electrically coupled to the second chip through a second path.

In accordance with an embodiment, a semiconductor package device may be provided. The semiconductor package device may include a first chip, and a second chip located under the first chip and located over a substrate. The semiconductor package device may include a first wafer test pad located in an upper edge region of the first chip. The semiconductor package device may include a connection member formed below the substrate, and electrically coupled to the first wafer test pad.

DETAILED DESCRIPTION

Reference will now be made to embodiments of the present disclosure, examples of which are illustrated in the accompanying drawings. Wherever possible, the same reference numbers are used throughout the drawings to refer to the same or like portions. In the following description of the present disclosure, a description of related known configurations or functions incorporated herein may be omitted for clarity of the subject matter of the present disclosure.

Figure 1:
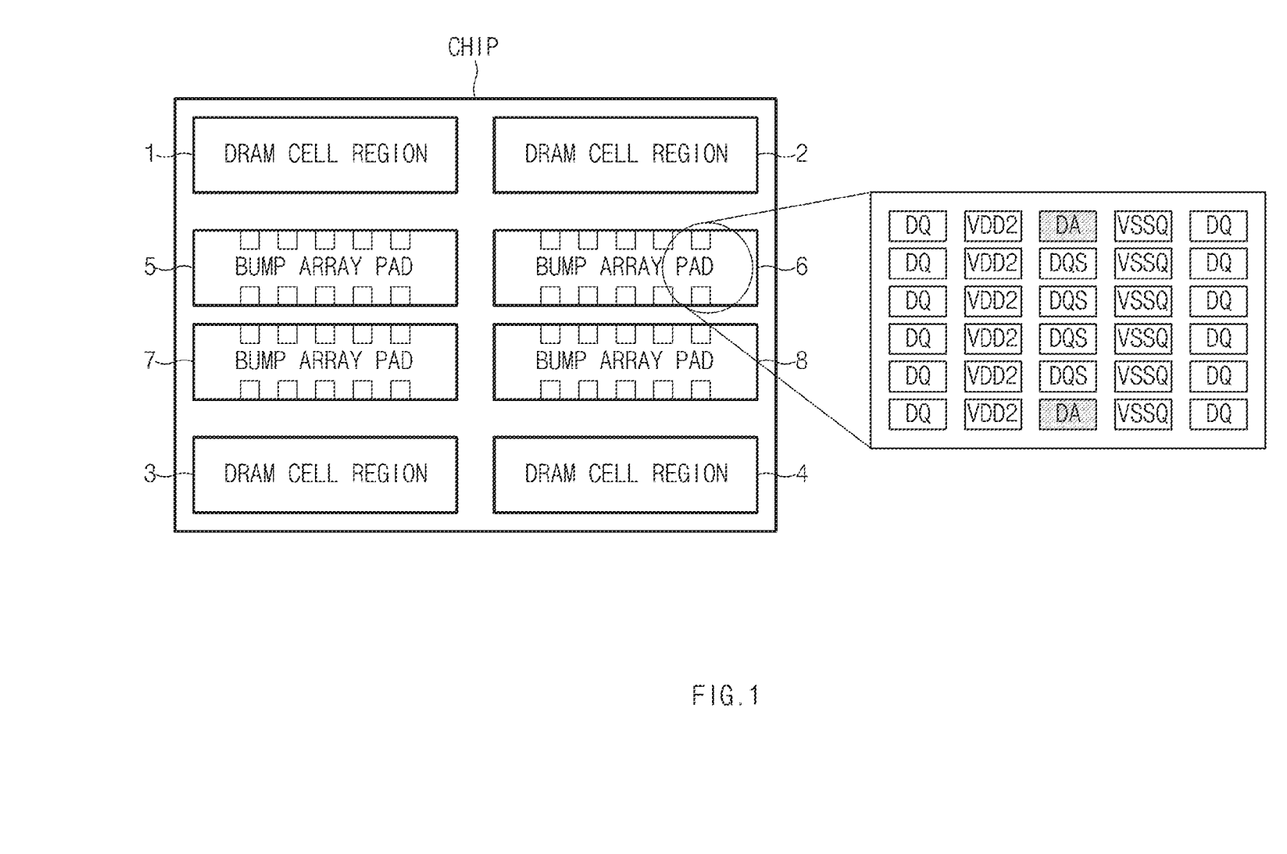
FIG. 1 is a block diagram illustrating a representation of an example of a semiconductor package device according to an embodiment of the present disclosure.

FIG. 1 is a block diagram illustrating a representation of an example of a semiconductor package device according to an embodiment of the present disclosure.

In the semiconductor package device illustrated in FIG. 1, a Dynamic Random Access Memory (DRAM) chip may include a plurality of DRAM cell regions (1, 2, 3, 4) and a plurality of bump array pads (5, 6, 7, 8).

The DRAM cell regions (1~4) may be arranged at the outermost region of the semiconductor chip (CHIP). Each DRAM cell region (1, 2, 3 or 4) may include a plurality of memory cells. Respective DRAM cell regions (1~4) may be classified according to a plurality of banks storing data or a plurality of channels, such that the DRAM cell regions (1~4) may store data received from an external part or may output the stored data to the external part.

The bump array pads (5~8) may be configured to transmit and receive signals to and from an external system. The bump array pads (5~8) may be arranged in the center region of the upper DRAM cell regions (1, 2) and the lower DRAM cell regions (3, 4).

Each bump array pad (5, 6, 7 or 8) may include a bump pad for transmitting data (DQ), a power bump pad for providing a power-supply voltage (VDD2, VSSQ), a bump pad for transmitting a signal (DQS), and a bump pad for a direct access (DA) test. In this example, the bump pad for a DA test may be arranged between the bump array pads (5~8), and may be coupled to an external direct access (DA) ball located outside the package.

When a system enterprise attempts to estimate only unique characteristics of DRAMs, there is needed a mode in which input signals are directly applied to DRAMs without passing through the system. That is, the DA (Direct Access) mode test scheme is used to test memory cells contained in a bank of each channel. During the DA mode test, a micro-bump for a DA test is used.

Figure 2:
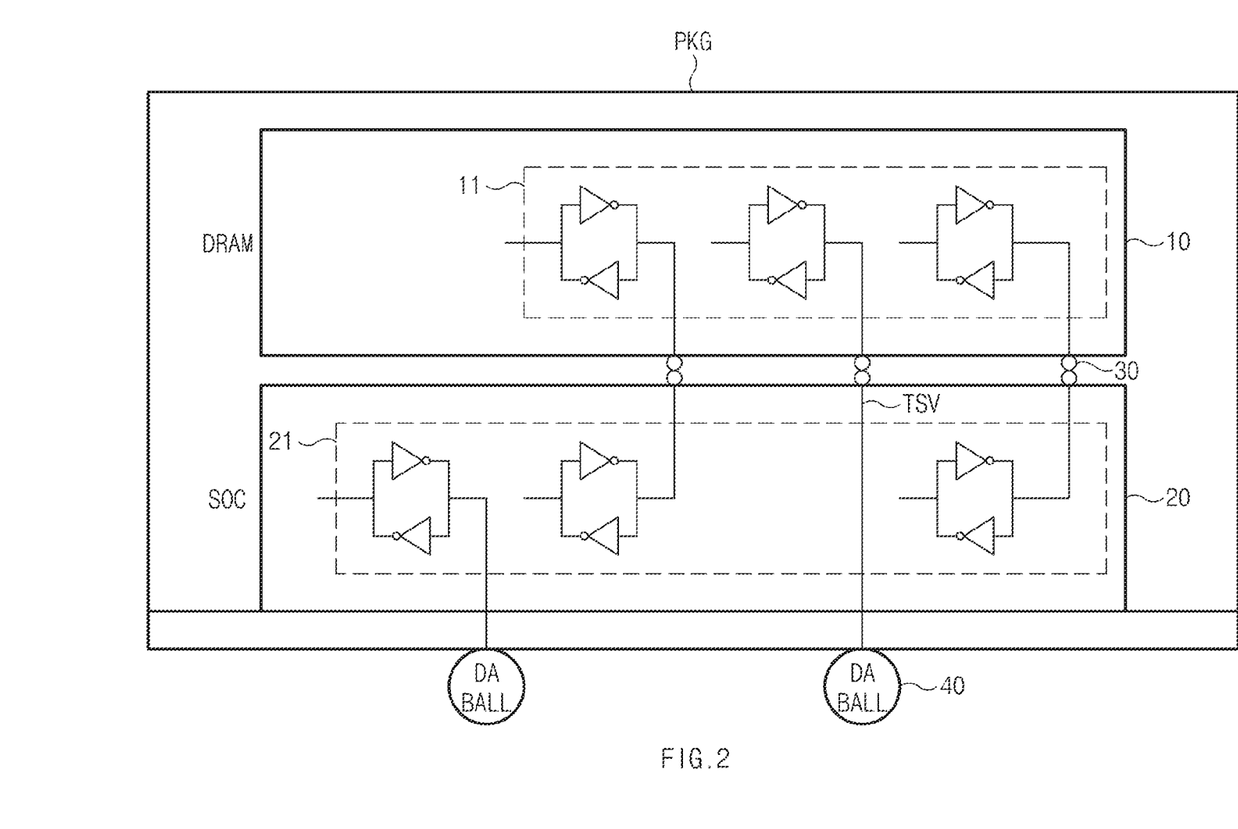
FIG. 2 is a block diagram illustrating a representation of an example of a semiconductor package device according to an embodiment of the present disclosure.

FIG. 2 is a block diagram illustrating a representation of an example of a semiconductor package device according to an embodiment of the present disclosure.

Referring to FIG. 2, a DRAM chip 10 may be disposed over a package device (PKG). A System On Chip (SOC) 20 for controlling the DRAM chip 10 may be formed below the DRAM chip 10. The DRAM chip 10 may include a plurality of internal circuit units 11, and the SOC 20 may include a plurality of internal circuit units 21.

The DRAM chip 10 and the SOC 20 may be electrically interconnected through a plurality of micro-bumps 30. The DRAM chip 10 and the SOC 20 may be interconnected through a through silicon via (TSV) to transmit signals and data of the internal circuit units (11, 21).

The internal circuit units (11, 21) may be configured to perform a variety of dedicated operations. The internal circuit units (11, 21) may be configured to communicate with the SOC 20 through the micro-bumps 30 during a normal operation, and may be configured to input/output data through the DA balls 400 connected through the micro-bumps 30 during a test operation.

The package device (PKG) may include a plurality of micro-bumps 30 located in the center region between the DRAM chip 10 and the SOC 20. The package device (PKG) may include the DRAM chip 10 coupled to the DA balls 40 of a lower region through TSVs of the SOC 20.

DRAM having a wide IO (Input and Output) structure may include the DA ball 40 in the external part of the package device (PKG), such that the wide IO DRAM can directly test the DRAM chip 10 without using the SOC 20. The micro-bump 30 coupled to the external DA ball is mainly arranged in the center region.

However, in order to perform the DA test of the DRAM chip 10, a connection line of the DRAM chip 10 coupled to the DA ball 40 must pass through the SOC 20. That is, a path of the TSV line coupled to the micro-bump 30 must be formed over the SOC 20.

In this case, a plurality of TSV lines needed for testing the DRAM chip 10 must pass through the center region of the SOC 20, such that the SOC 20 is unavoidably increased in size. In addition, the DRAM chip 10 must further include separate micro-bumps coupled to the DA ball 40 to perform the DA test, such that the DRAM chip 10 is unavoidably increased in size.

Figure 3:
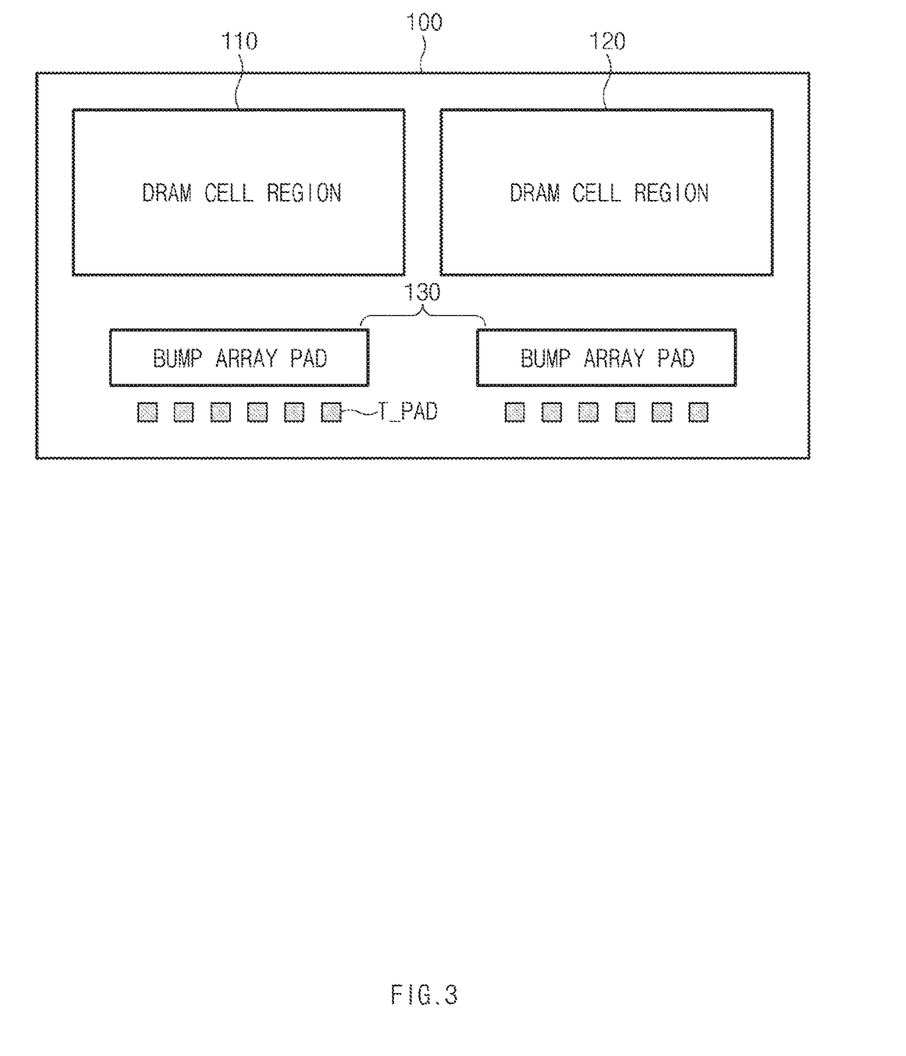
FIG. 3 is a schematic diagram illustrating a representation of an example of a semiconductor package device according to an embodiment of the present disclosure.

FIG. 3 is a schematic diagram illustrating a representation of an example of a semiconductor package device according to an embodiment of the present disclosure.

The semiconductor package device of FIG. 3 may be applied to a Low Power High Bandwidth Memory (LPHBM) configured to have a large bandwidth through low power consumption. In addition, the DRAM chip 100 of FIG. 3 may include two DRAM cell regions (110, 120), such that the DRAM chip 100 may be formed in a wide IO half chip shape. A description thereof will hereinafter be described.

In addition, although the semiconductor memory chip according to the embodiments is, for example, comprised of the DRAM chip 100 for convenience of description and better understanding of the present disclosure, the scope or spirit of the present disclosure is not limited thereto, and it should be noted that categories of memory chips contained in the package of the embodiments are not limited.

For example, the semiconductor memory chip may include a Dynamic Random Access Memory (DRAM), or may include non-volatile memories, for example, a Ferroelectric Random Access Memory (FeRAM), a Phase-change Random Access Memory (PRAM), a Magnetic Random Access Memory (MRAM), a flash memory, etc.

In the semiconductor package device according to the embodiments, the DRAM chip 100 may include a plurality of DRAM cell regions (110, 120) and a plurality of bump array pads 130.

In this case, the plurality of DRAM cell regions (110, 120) may be arranged in the upper region of the DRAM chip 100. The plurality of bump array pads 130 may be arranged in the lower region of the DRAM cell regions (110, 120). The bump array pad 130 may be coupled to a plurality of micro-bumps configured to input/output data of the DRAM cell regions (110, 120) to/from the external part.

A plurality of wafer test pads (T_PAD) may be arranged in the lower region of the bump array pad 130. It may be impossible for the wafer test pads (T_PAD) to perform direct probing of the bump pad to acquire the bump-pad size and stable seating of the micro-bumps, such that the wafer test pads (T_PAD) may substitute for the bump pad to perform probing during the wafer test. The wafer test pad (T_PAD) may be relatively larger in size than the bump pad, resulting in facilitation of test probing.

With the increasing integration degree of semiconductor devices, the importance of test technology for testing functions of complicated semiconductor devices is gradually increasing. Basic testing of semiconductor devices is performed in association with each unit process. Subsequently, electrical testing of overall semiconductor chips is performed at a wafer level using a tester and a probe station, after completion of semiconductor chip fabrication.

The wafer level test may be used in different ways according to categories and functions of the semiconductor devices. However, the wafer level tests may be classified into an open short test, a functional test, a Direct Current (DC) test indicating a DC-based current-voltage characteristic test, an Alternating Current (AC) test indicating an AC-based speed test, etc.

The wafer level test selects and removes a defective (or faulty) semiconductor device in the last step of the semiconductor fabrication processes, and analyzes the reason of the selected defective semiconductor device, such that various problems can be solved, resulting in improvement of overall fabrication capability and overall productivity.

The above-mentioned wafer level test is a process for measuring electrical characteristics of constituent elements of the semiconductor chip using a needle of a probe card mounted to the probe station. The needle of the probe card may contact the wafer test pad (T_PAD) electrically coupled to a semiconductor chip, i.e., the pad formed in a scribe lane of the wafer.

After an electric signal is applied through the needle, the presence or absence of a defective part in the semiconductor chip may be determined by the signal checked by the electric signal. Namely, constituent elements of the semiconductor chip may determine the electrical characteristics. In this way, the test pad used in the wafer level test is denoted by a wafer test pad (T_PAD).

In accordance with an embodiment, the bump array pad 130 is not arranged in the center region of the DRAM cell regions (110, 120), and is arranged in the lower region of the DRAM chip 100, resulting in reduction of the DA test loading on the SOC.

Figure 4:
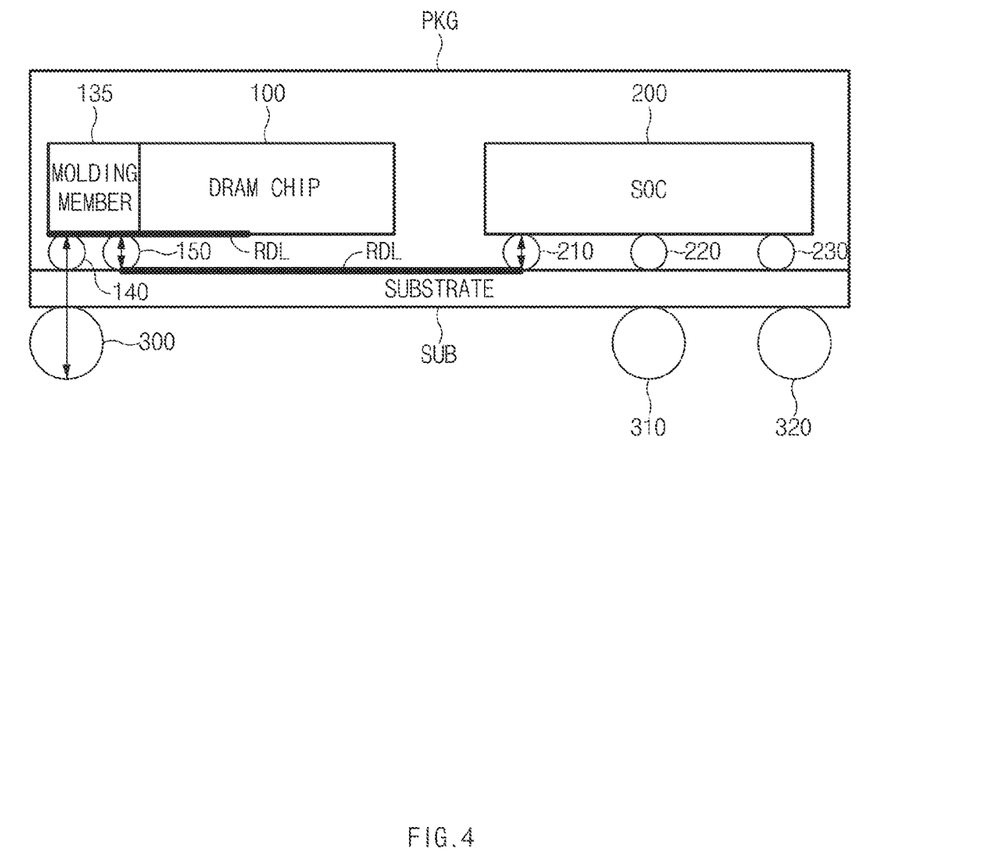
FIG. 4 is a cross-sectional view illustrating a representation of an example of the semiconductor package device illustrated in FIG. 3.

FIG. 4 is a cross-sectional view illustrating a representation of an example of the semiconductor package device illustrated in FIG. 3.

Referring to FIG. 4, the semiconductor package device according to an embodiment may include a DRAM chip 100 in the package (PKG). The SOC 200 may be arranged in a region adjacent to the DRAM chip 100 on the same layer or substantially the same layer as in the DRAM chip 100.

With rapid development of industrial technologies, the demand of users who desire to use high-speed multifunctional products is rapidly increasing. Various electronic products have been developed to meet the above demand, for example, chip scale package products or chip size package products. A representative example of the above electronic products is a System On Chip (SOC), and the SOC 200 may be coupled to a plurality of bump pads.

In this case, the SOC 200 may include a memory controller for controlling the DRAM chip 100, an Intellectual Property (IP), a Central Processing Unit (CPU) for controlling the memory controller and the IP, a system bus for interconnecting the memory controller, the IP, and the CPU, etc. The IP may access any one of the plurality of memory chips through the memory controller.

A predetermined region of the left edge of the DRAM chip 100 may be molded with a molding member 135. In an embodiment, a predetermined region of an edge of the DRAM chip 100 may be molded into or with a molding member 135. The micro-bumps (140, 150) may be coupled to the DRAM chip 100 through the upper molding member 135. In an embodiment, the molding member 135 may be formed of epoxy material. In an embodiment, the molding member 135 may be located over the test micro-bump 140 and the normal micro-bump 150.

The micro-bumps (140, 150) may be coupled to the DRAM chip 100 through a re-distribution layer (RDL). That is, after the re-distribution layer (RDL) is formed at the outer wall of the DRAM chip 100 using the molding member 135, the RDL may be coupled to the micro-bumps (140, 150).

The micro-bumps (140, 150) may be formed over a package substrate (SUB). The DA ball 300 may be formed below the substrate (SUBSTRATE), and may be coupled to the micro-bump 140. In this case, the DA ball 300 may correspond to a connection member coupled to an external test terminal.

The micro-bump 140 from among the micro-bumps (140, 150) according to the embodiments may be used as a DA test micro-bump for directly testing the DRAM chip 100. The micro-bump 140 from among the micro-bumps (140, 150) according to the embodiments may be used as a test micro-bump for directly testing the DRAM chip 100. The remaining micro-bumps 150 may be used as normal micro-bumps 150 for inputting/outputting address or data to the SOC 200.

The micro-bumps 150 may be used to transmit signals associated with the interface of the DRAM chip 100. In other words, although the signals are denoted by data or address for convenience of description, the scope or spirit of the signals is not limited thereto, and the signals may further include other signals such as clock signals, data strobe signals, etc. In an embodiment, the micro-bumps 150 may be normal micro-bumps located at a layer below the first chip and above the substrate SUB. In an embodiment, a second path through the micro-bump 210 (i.e., as indicated by the line with arrows through the element 210) and RDL may electrically couple the second chip 200 to the micro-bump 150.

In an embodiment, the micro-bump 140 may be located at a layer below a first chip 100, and may be electrically coupled to an external connection 300 through a first path (i.e., as indicated by the line with arrows through the elements 140, SUB, and 300 of FIG. 4). For example, the micro-bump 140 may be coupled to the DA ball 300 located outside the package (PKG) to perform the DA test, and the micro-bump 150 may be coupled to the micro-bump 210 of the SOC 200 through the re-distribution layer (RDL).

The plurality of micro-bumps (210~230) may be formed in the lower region of the SOC 200. The micro-bumps (210~230) may be coupled to the micro-bump 150 of the DRAM chip 100 through the RDL. The micro-bumps (210~230) may be formed over the substrate (SUBSTRATE).

The DA balls (310, 320) may be formed below the substrate (SUBSTRATE). The substrate (SUBSTRATE) may be formed of a printed circuit board (PCB). The DA balls (310, 320) may be coupled to the external host (i.e., the external system), and may include a plurality of solder balls.

Figure 5:
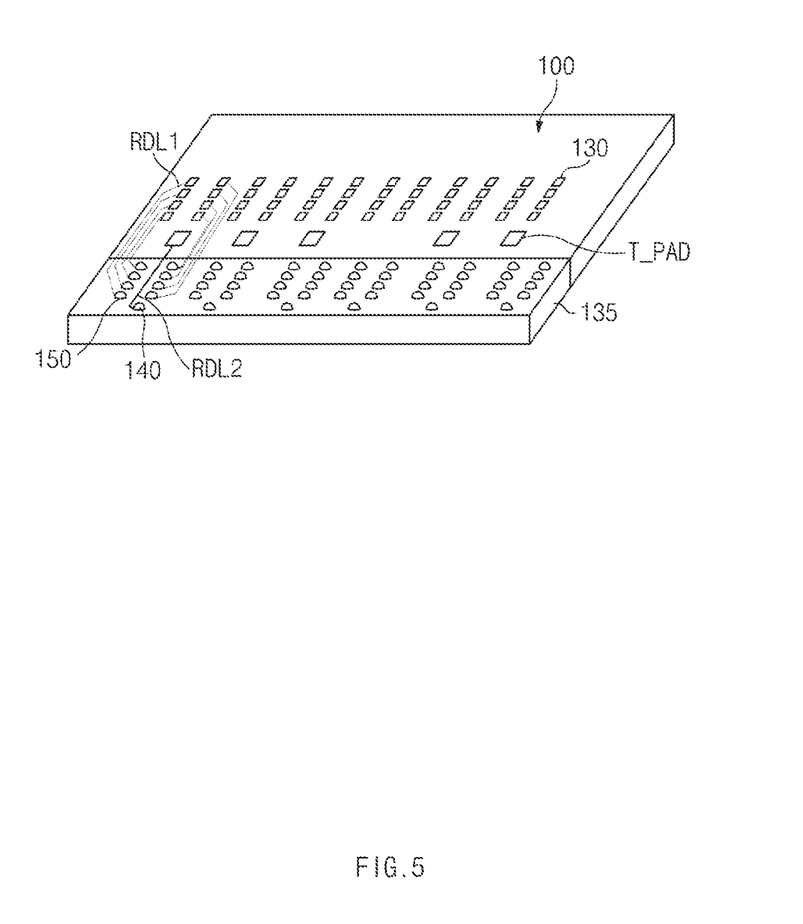
FIG. 5 is a perspective view illustrating a representation of an example of the semiconductor package device illustrated in FIG. 3.

FIG. 5 is a perspective view illustrating a representation of an example of the semiconductor package device illustrated in FIG. 3.

Referring to FIG. 5, the semiconductor package device according to an embodiment may include a plurality of bump array pads 130 and a plurality of wafer test pads (T_PAD) formed over the DRAM chip 100. The DRAM chip 100 may be coupled to the molding member 135, and the plurality of micro-bumps 150 and the plurality of DA test micro-bumps 140 may be formed over the molding member 135.

In this case, the plurality of micro-bumps 150 may be coupled to the bump array pad 160 through a re-distribution layer (RDL1). The DA test micro-bumps 140 may be coupled to the wafer test pad (T_PAD) through a re-distribution layer (RDL2).

In addition, after packaging completion, the DA test micro-bumps 140 may be coupled to the DA ball 300 as illustrated in FIG. 4, such that the DRAM chip can be directly tested through the wafer test pad (T_PAD) at the outside of the package (PKG).

Figure 6:
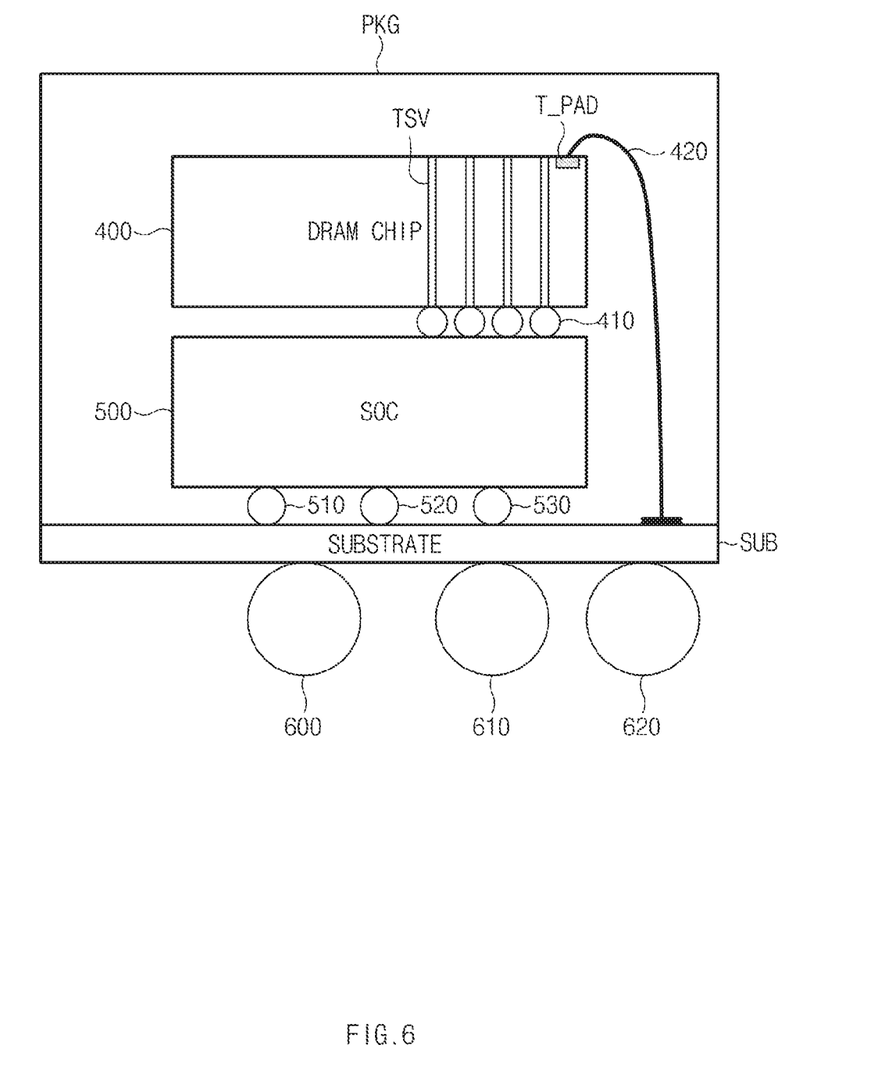
FIG. 6 is a schematic diagram illustrating a representation of an example of an embodiment of the semiconductor package device illustrated in FIG. 3.

FIG. 6 is a schematic diagram illustrating a representation of an example of an embodiment of the semiconductor package device illustrated in FIG. 3.

Referring to FIG. 6, the semiconductor package device according to an embodiment may include a DRAM chip 400 and a system chip 500 which are stacked in the package (PKG). That is, the DRAM chip 400 may be formed above the SOC 500. One DRAM chip 400 may be formed above the SOC 500 as illustrated in FIG. 6.

The DRAM chip 400 formed in the upper part and the SOC 500 formed in the lower part may be electrically interconnected through the micro-bump 410. The DRAM chip 400 may be coupled to the lower micro-bump 410 through a through silicon via (TSV). The semiconductor devices configured to provide the wide IO may be stacked on a single package chip using the TSV.

The wafer test pad (T_PAD) may be formed in the upper edge region of the DRAM chip 400. Each micro-bump ball of the micro-bump 410 is very small in size. As a result, since it may be impossible to test the wide IO-based DRAM by directly touching the micro-bump 410, the wide IO-based DRAM may essentially include the wafer test pad (T_PAD).

The wafer test pad (T_PAD) may be coupled to the lower substrate (SUB) through wire bonding 420. In this case, the wafer test pad (T_PAD) may be formed in the upper right edge region of the DRAM chip 400, and may be coupled to the lower substrate (SUB), such that the wafer test pad (T_PAD) is arranged to reduce the length of the wire bonding 420.

The SOC 500 may be coupled to the substrate (SUB) through a plurality of micro-bumps (510~530) formed in the lower part. In this case, a plurality of DA balls (600~620) may correspond to a connection member coupled to the external test terminal.

As a representative example of the next-generation DRAM capable of increasing a bandwidth, the wide IO DRAM having low-frequency characteristics and a plurality of I/O lines has recently been developed. The wide IO is a 3D (3-dimensional) DRAM based on TSV, and is formed by stacking the DRAM chips 400 over the SOC 500. The above-mentioned stacked package (PKG) can reduce a large amount of current consumption by minimizing I/O loading.

In order to satisfy a high memory bandwidth requisite for the DRAM chip 400, the DRAM chip 400 may include the Wide IO (wide input/output). The term "wide IO" may indicate that the DRAM chip 400 is directly coupled to the SOC 500 by applying the TSV to the DRAM chip 400.

Therefore, the wide IO-based DRAM chip 400 can be applied to various devices (e.g., 3D gaming, high-density (HD) video, etc.) designed to perform application programs by requesting a high memory bandwidth.

If the wide IO is finally manufactured in the form of a package after the DRAM chip 400 is stacked over the SOC 500, the DRAM must be directly tested at the outside of the package. For this purpose, the DA balls (600~620) for testing the package (PKG) are needed for the direct access test.

The embodiments of the present disclosure can perform the direct access (DA) test of the DRAM chip 400 using the wafer test pad (T_PAD) needed for wafer testing, without using a separate DA test micro-bump, in such a manner that the DA test can be performed on the DRAM chip 400.

Figure 7:
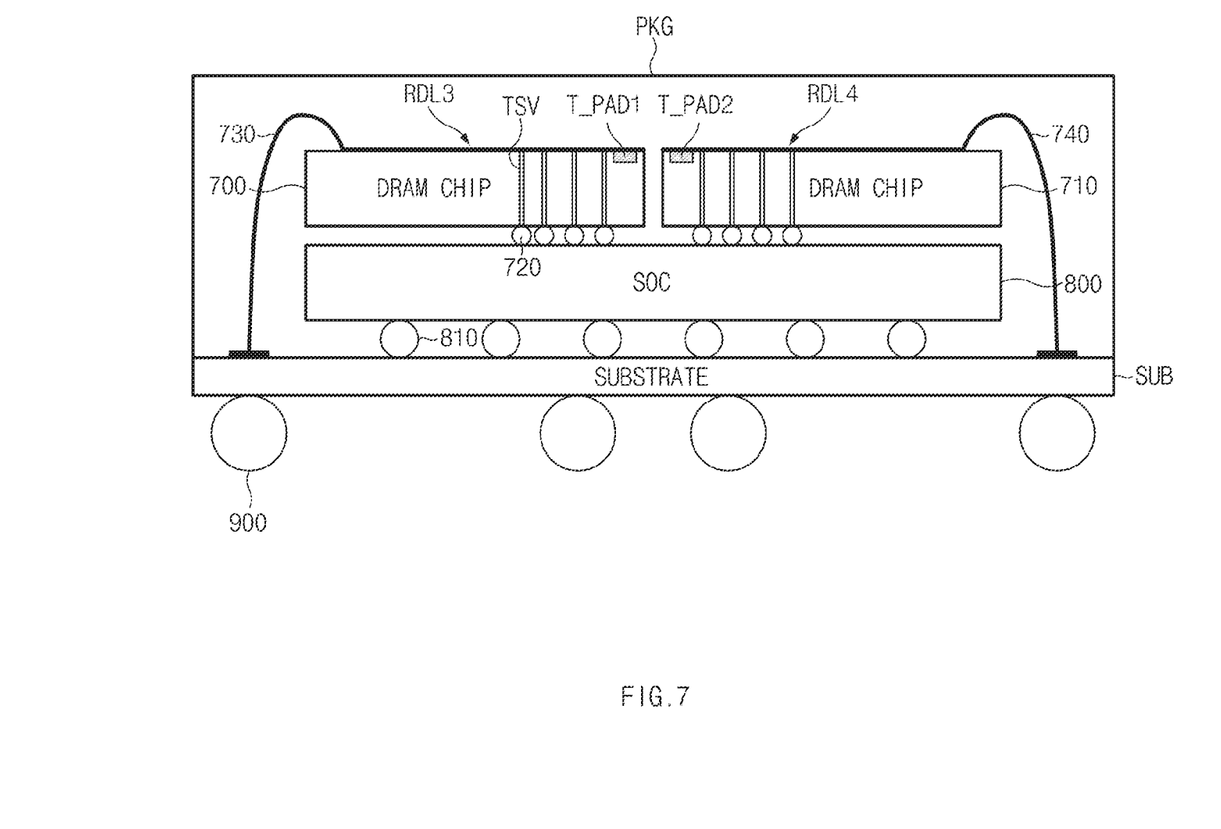
FIG. 7 is a schematic diagram illustrating a representation of an example of an embodiment of the semiconductor package device illustrated in FIG. 3.

FIG. 7 is a schematic diagram illustrating a representation of an example of an embodiment of the semiconductor package device illustrated in FIG. 3.

Referring to FIG. 7, the semiconductor package device according to an embodiment may include DRAM chips (700, 710) and a system chip 800 stacked in the package (PKG).

That is, the DRAM chips (700, 710) may be formed over the SOC 800, and the DRAM chip 700 may be formed adjacent to the DRAM chip 710. Two DRAM chips (700, 710) may be formed over the SOC 800 as illustrated in FIG. 7.

The DRAM chips (700, 710) formed in the upper part and the SOC 800 formed in the lower part may be electrically interconnected through the micro-bump 720. The DRAM chips (700, 710) may be coupled to the lower micro-bump 720 through the TSV.

The wafer test pads (T_PAD1, T_PAD2) may be formed in the upper edge region of the DRAM chips (700, 710). The wafer test pads (T_PAD1, T_PAD2) may be coupled to wire bondings (730, 740) through re-distribution layers (RDL3, RDL4). The RDLs (RDL3, RDL4) may be coupled to the lower substrate (SUB) through wire bondings (730, 740).

In this case, the wafer test pad (T_PAD1) may be formed in the upper right edge region of the DRAM chip 700, such that the wafer test pad (T_PAD1) may be coupled to the lower substrate (SUB) through the re-distribution layer (RDL3) and the wire bonding 730. The wafer test pad (T_PAD2) may be formed in the upper left edge region of the DRAM chip 710, and may be coupled to the lower substrate (SUB) through the re-distribution layer (RDL4) and the wire bonding 740.

The wafer test pad (T_PAD1) may be arranged in the upper left edge region of the DRAM chip 700, and the wafer test pad (T_PAD2) may be arranged in the upper right edge region of the DRAM chip 710. In this case, a horizontal width of the SOC 800 may be increased by a horizontal width of the DRAM chips (700, 710). In order to address this issue, the wafer test pads (T_PAD1, T_PAD2) according to the embodiments are adjacent to each other.

In order to reduce the size of the SOC 800, it may be impossible for signals for testing the DRAM chips (700, 710) to be arranged in the center region of the SOC 800. Therefore, after the wafer test pad (T_PAD1) is formed in the upper right edge region of the DRAM chip 700 and the wafer test pad (T_PAD2) is formed in the upper left edge region of the DRAM chip 710, re-distribution layers (RDL3, RDL4) are coupled to each other.

The wire bondings (730, 740) are arranged at the left/right outer walls of the SOC 800 through re-distribution layers (RDL3, RDL4), such that signal line loading of the SOC 800 can be reduced.

The SOC 800 may be coupled to the substrate (SUB) through the plurality of micro-bumps 810 formed in the lower part. The plurality of DA balls 900 may be formed below the substrate (SUB). In this case, each DA ball 900 may correspond to a connection member coupled to an external test terminal.

The embodiments of the present disclosure can replace the DA test micro-bump present in the bump array of the DRAM chip with the wafer test pad (T_PAD), resulting in reduction of the chip size. In addition, the DA test line contained in the center region of the chip need not be arranged in the SOC, such that the SOC size can be reduced.

As is apparent from the above description, the semiconductor package device according to the embodiments of the present disclosure are configured to perform a direct access test in a package state using a wafer test pad, such that a system on chip (SoC) and a semiconductor package can be reduced in size.

Those skilled in the art will appreciate that the embodiments may be carried out in other specific ways than those set forth herein without departing from the spirit and essential characteristics of the application. The above embodiments are therefore to be construed in all aspects as illustrative and not restrictive. The scope of the application should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment or included as a new claim by a subsequent amendment after the application is filed.

Although a number of illustrative embodiments consistent have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A semiconductor package device comprising:
   a first chip located over a substrate;
   a second chip located over the substrate and adjacent to the first chip on the same layer as in the first chip;
   a test micro-bump located at a layer below the first chip and above the substrate, and electrically coupled to an external connection member through a first path;
   a normal micro-bump located at a layer below the first chip and above the substrate, and electrically coupled to the second chip through a second path;
   a molding member molded into a predetermined region of an outer wall of the first chip, and formed over the test micro-bump and the normal micro-bump;
   a plurality of micro-bumps located between a lower region of the second chip and the substrate;
   a first re-distribution layer (RDL) configured to couple the test micro-bump to the first chip through the molding member; and
   a second re-distribution layer (RDL) configured to couple the normal micro-bump to the plurality of micro-bumps,
   wherein the first re-distribution layer (RDL) is directly connected to a lower region of the molding member and the first chip.

2. The semiconductor package device according to claim 1, wherein the second chip is a System On Chip (SOC).

3. The semiconductor package device according to claim 1, wherein the first chip includes a Dynamic Random Access Memory (DRAM).

4. The semiconductor package device according to claim 1, further comprising:
   a first re-distribution layer (RDL) configured to couple the normal micro-bump to the first chip through the molding member.

5. The semiconductor package device according to claim 1, wherein the test micro-bump is configured for usage in a Direct Access (DA) test mode in which the first chip is directly tested through the first path.

6. The semiconductor package device according to claim 1, further comprising:
   a wafer test pad arranged in a lower contour region of the first chip.

7. The semiconductor package device according to claim 6, wherein the wafer test pad is coupled to the test micro-bump through a re-distribution layer (RDL).

8. The semiconductor package device according to claim 6, wherein the wafer test pad is configured to be used to perform probing during wafer-level testing.

9. The semiconductor package device according to claim 1, wherein the external connection member comprises a direct access ball.

10. The semiconductor package device according to claim 1, wherein the substrate comprises a printed circuit board.

11. A semiconductor package device comprising:
    a substrate;
    a first chip;
    a second chip located under the first chip and located over the substrate;
    a first wafer test pad located in an upper edge region of the first chip; and
    a connection member formed below the substrate, and electrically coupled to the first wafer test pad,
    wherein the first wafer test pad is formed in an upper edge region adjacent an outer wall of the chip,
    wherein the first wafer test pad is directly connected to the substrate through wire bonding.

12. The semiconductor package device according to claim 11, wherein the second chip is a System On Chip (SOC).

13. The semiconductor package device according to claim 11, wherein the first chip includes a Dynamic Random Access Memory (DRAM).

14. The semiconductor package device according to claim 11, wherein the first chip is electrically coupled to the second chip through a micro-bump.

15. The semiconductor package device according to claim 11, further comprising:
    a plurality of micro-bumps coupled between the second chip and the substrate.

16. The semiconductor package device according to claim 11, further comprising:
    a third chip located over the second chip, and arranged adjacent to the first chip.

17. The semiconductor package device according to claim 16, wherein the third chip includes a Dynamic Random Access Memory (DRAM).

18. The semiconductor package device according to claim 16, further comprising:
    a second wafer test pad formed in an upper edge region of the third chip, and coupled to the substrate through wire bonding.

19. The semiconductor package device according to claim 18, wherein:
    the first wafer test pad is formed in an upper left edge region of the first chip; and
    the second wafer test pad is formed in an upper right edge region of the third chip,
    whereby the first wafer test pad is arranged adjacent to the second wafer test pad.

20. The semiconductor package device according to claim 18, wherein:
    the first wafer test pad is formed in an upper edge region of the first chip adjacent an outer wall of the first chip; and
    the second wafer test pad is formed in an upper edge region of the third chip adjacent an outer wall of the third chip,
    whereby the first wafer test pad is arranged adjacent to an outer wall of the second chip and the second wafer test pad is arranged adjacent to another outer wall of the second chip opposite the outer wall of the second chip.

21. The semiconductor package device according to claim 18, further comprising:
    a first re-distribution layer (RDL) coupled to wire bonding and configured to interconnect the first wafer test pad and the substrate; and
    a second re-distribution layer (RDL) coupled to wire bonding and configured to interconnect the second wafer test pad and the substrate.

* * * * *